United States Patent [19]
van Roermund

[11] Patent Number: 4,569,072
[45] Date of Patent: Feb. 4, 1986

[54] CLOCK-CONTROLLED FILTERING ARRANGEMENT

[75] Inventor: Arthur H. M. van Roermund, Eindhoven, Netherlands

[73] Assignee: U.S. Philips Corporation, New York, N.Y.

[21] Appl. No.: 553,909

[22] Filed: Nov. 21, 1983

[30] Foreign Application Priority Data

Dec. 3, 1982 [NL] Netherlands ............ 8204687

[51] Int. Cl.⁴ ............................................. H04H 5/00
[52] U.S. Cl. ...................................... 381/7; 328/167; 381/13; 455/306; 455/307
[58] Field of Search .............. 381/4, 7, 13; 364/724; 328/167; 375/102; 455/296, 303, 305, 306, 307

[56] References Cited

U.S. PATENT DOCUMENTS

| | | | |
|---|---|---|---|
| 3,943,293 | 3/1976 | Bailey | 381/13 |
| 4,016,410 | 4/1977 | Eggermont | 328/167 |
| 4,246,441 | 1/1981 | Sugai et al. | 381/13 |
| 4,286,318 | 8/1981 | Immink et al. | 358/227 |
| 4,314,377 | 2/1982 | Kondo et al. | 455/305 |
| 4,392,068 | 7/1983 | Welles, II | 328/167 |
| 4,419,541 | 12/1983 | Kishi et al. | 381/13 |
| 4,420,815 | 12/1983 | Francis | 364/724 |
| 4,456,990 | 6/1984 | Fisher et al. | 455/296 |

FOREIGN PATENT DOCUMENTS

| | | | |
|---|---|---|---|
| 55-66152 | 5/1980 | Japan | 381/13 |
| 56-28531 | 3/1981 | Japan | 381/13 |

Primary Examiner—Forester W. Isen
Attorney, Agent, or Firm—Thomas A. Briody; William J. Streeter; Marianne Rich

[57] ABSTRACT

A clock-controlled filtering arrangement for suppressing a number of interference frequencies related to a clock frequency, which comprises a time-discrete comb filter included in a negative feedback loop for a selective negative feedback of the said interference frequencies, which time-discrete comb filter is connected to an output of a clock generator for controlling the frequency location of the pass ranges of the comb filter. In order to avoid on the one hand the introduction of quantizing noise and the use of additional circuits, such as A/D and D/A converters, and on the other hand the occurrence of error cumulation while maintaining an adequate interference suppression, the time-discrete comb filter is of the switched capacitor N-path filter type.

4 Claims, 9 Drawing Figures

CLOCK-CONTROLLED FILTERING ARRANGEMENT

The invention relates to a clock-controlled filtering arrangement for suppressing a number of interference frequencies related to a clock frequency, which comprises a time-discrete comb filter included in a negative feedback loop for a selective negative feedback of said interference frequencies, this time-discrete comb filter being connected to an output of a clock generator for controlling the frequency location of the pass ranges of the comb filter.

Such a filtering arrangement is known from the Dutch Patent Application No. 7901721 laid open for public inspection.

The known filtering arrangement acts as a servo control loop and is used for controlling the position of an adjusting member in an optical reading device for disk-shaped record carriers. Such record carriers comprise optically detectable video and/or audio information, which is recorded in a mostly spiral information track. The position of the adjusting member determines the scanning spot. In order to obtain a correct detection, this scanning spot should accurately follow the information track during reading. Due to errors, such as, for example, eccentricity or unevennesses of the record carrier, the scanning spot may deviate periodically from the information track. As a result, interference frequencies occur in the detected signal, which are related to the frequency of revolution of the record carrier and/or higher harmonics thereof. By selecting these interference frequencies by means of the comb filter and thus controlling the position of the adjusting member through an electromechanical converter, an interference negative feedback is obtained, whereby the scanning spot continues to follow the information track notwithstanding the occurrence of the said errors. Consequently, the interference frequencies in the detected signal are suppressed.

A correct selection of the interference frequencies to be suppressed is essential to an effective negative feedback. For this purpose, the comb filter of the known filtering arrangement comprises a digital shift register which acts as a delay line and is controlled by means of a clock frequency related to the frequency of revolution of the record carrier. This clock frequency is supplied by a tachogenerator which is included in the clock generator and is coupled to the rotary shaft of the driving member of the reading device. The pass ranges of the comb filter are thus frequency-coupled to the interference frequencies to be selected so that a correct selection can be maintained even with variations in the frequency of revolution of the record carrier.

The use of a digital shift register as a delay line introduces undesired quantizing noise, as a result of which the signal-to-noise ratio is adversely affected. Moreover, such a digital shift register absorbs a comparatively large quantity of power and additional circuits, such as, for example, A/D and D/A converters, are required. In the case of integration, the known filtering arrangement thus occupies a comparatively large substrate surface area.

With the use of an analogue shift register instead of a digital shift register, the occurrence of quantizing noise is avoided, it is true, but a cumulation of errors occurs when the signal is shifted on in the shift register, as a result of which a disturbance is obtained in the frequency coupling between the selective pass ranges of the comb filter and the interference frequencies. This disturbance is so large that a filtering arrangement of the kind mentioned in the opening paragraph, of which the comb filter comprises an analogue shift register as a delay line, cannot operate satisfactorily.

The invention has for its object to provide a filtering arrangement of the kind mentioned in the opening paragraph having a stable frequency coupling between the selective pass ranges of the comb filter on the one hand and the interference frequencies to be suppressed on the other hand, which moreover can be realized in a simple manner without the use of additional circuits and which requires a smaller quantity of power than the known filtering arrangement.

A filtering arrangement according to the invention is therefore characterized in that the time-discrete comb filter is of the switched capacitor N-path filter type.

A comb filter of said type is known per se from the article "A switched capacitor N-path filter" by D. J. Allstot and K. S. Tan, published on "Proceedings of the 1981 I.E.E.E. International Symposium on Circuits and Systems", p. 313–316. This comb filter has the properties on the one hand that its signal processing is analogue and the location and bandwidth of the pass ranges are controlled and adjusted, respectively, in a simple manner and on the other hand that the amplitude of the pass ranges is non-uniform and can be made uniform only with great difficulty.

By the use of the said filter in a negative feedback loop, the latter property is prevented from resulting in an unequal suppression of interference frequencies.

When this comb filter is used in a filtering arrangement of the kind mentioned in the opening paragraph, a quiet analogue signal processing is obtained in the filtering arrangement. Consequently, on the one hand quantizing noise is avoided, while on the other hand a simple realization becomes possible without further additional circuits. Thus, the power consumption and the required substrate surface area in the case of integration with respect to that of the known filtering arrangement can be particularly small. Moreover, the selection of interference frequencies in the latter comb filter is effected, in contrast with the sequential signal processing during the delay in an analogue shift register, by means of parallel signal processing steps. As a result, a cumulation of errors in the negative feedback loop of the filtering arrangement according to the invention cannot possibly occur. Consequently, a particularly stable frequency coupling is obtained between the resonant frequencies of the comb filter and the interference frequencies to be suppressed.

A preferred embodiment of such a filtering arrangement is characterized in that it is included in a decoder circuit for stereo multiplex signals, which decoder circuit also comprises a time-discrete multiplier circuit, which is controlled from the same clock generator as the time-discrete comb filter.

This measure is based on the recognition of the fact that the filtering arrangement according to the invention is not only suitable for the suppression of interference frequencies in a servo control loop, but that it is in general particularly suitable for the suppression of interference signals having a very narrow band, which are related to a clock frequency and are contained in time-discrete signals. Such interference signals may be inherent, for example, to a given signal, for example, the 19 kHz stereo pilot signal in a stereo multiplex signal, or may be obtained by clock cross-talk or by a phase jitter in the case of inter alia a switching multiplication of such time-discrete signals, such as may occur, for example, in the stereo decoder described in U.S. Pat. No. 3,962,551. When the latter measure is used, the filtering arrangement as a whole acts as a suppression filter with peak-shaped suppression ranges which are frequency-coupled via the clock generator to the stereo pilot frequency and harmonics of the stereo pilot frequency.

According to a further preferred embodiment of such a filtering arrangement, the clock generator comprises a phase-locked loop to which is supplied a pilot frequency, for example, the 19 kHz stereo pilot frequency or the 57 kHz traffic pilot frequency.

The present invention will now be described, by way of example, with reference to the Figures shown in the accompanying drawings.

Figure 1A:
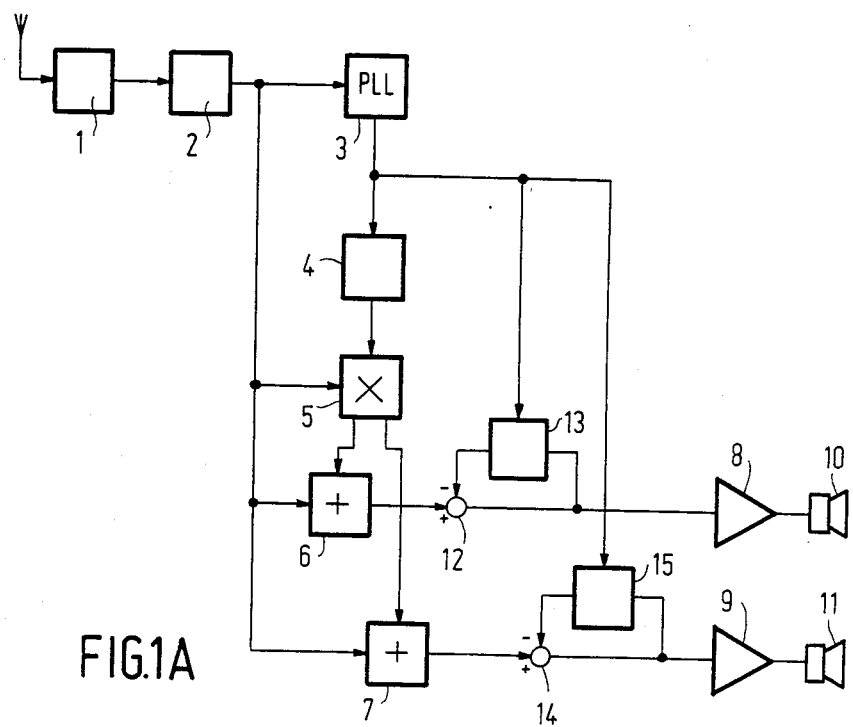
FIG. 1A shows an application of a filtering arrangement according to the invention in an FM stereo receiver.
Figure 1B:
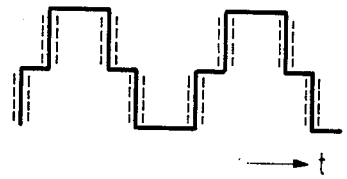
FIG. 1B shows the variation of a time-discrete 3-level mixed signal for the decoding of a stereo multiplex signal.
Figure 1C:
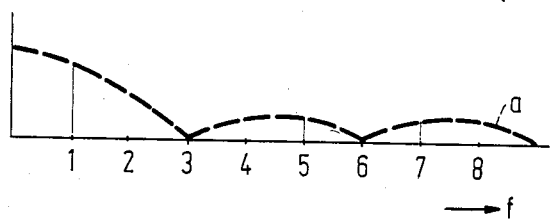
FIG. 1C shows the frequency spectrum of the latter mixed signal.

FIG. 1A shows an application of filtering arrangements 12-15 according to the invention in an FM stereo receiver 1-11, which is known per se, for example, from U.S. Pat. No. 3,962,551. The signal processing in this known FM stereo receiver is effected mainly as follows:

A desired HF-FM stereo reception signal is selected in an input/tuning part 1 and demodulated in an FM detector 2 to the fundamental frequency or base band. The stereo multiplex signal thus obtained is supplied on the one hand to a stereo decoder 5-7 and on the other hand to a phase-locked loop 3. In this phase-locked loop 3, a 228 kHz clock signal is regenerated, which is phase-coupled to a pilot frequency, for example, the 19 kHz stereo pilot frequency of the stereo multiplex signal or the 57 kHz traffic pilot frequency which is used in the German ARI system for the indication of a traffic transmitter. This 228 kHz clock signal is supplied to a function generator 4 in which a 38 kHz time-discrete 3-level mixing signal is produced in a manner described extensively in the said U.S. Pat. No. 3,962,551. The ideal form of this mixing signal is shown in FIG. 1B and the ideal frequency spectrum is shown in FIG. 1C in full lines. In the ideal frequency spectrum not only all the even harmonics, but also the $3^{rd}$, $6^{th}$, $9^{th}$ . . . harmonics of the 38 kHz fundamental wave are absent. The latter is due to the sin x/x function, which is indicated by the dotted curve a and which has its zero points in the last mentioned harmonic frequencies. A multiplication of this ideal mixing signal with the stereo multiplex signal in a mixer stage 5 connected to the function generator 4 and the FM detector 2 prevents interference components in the stereo multiplex signal at or about these harmonics from being converted to the fundamental frequency or base band and disturbing the demodulated stereo difference signal (L−R) at the output of the mixer stage 5. The mixer stage 5 is connected in push-pull arrangement and supplies the demodulated stereo difference signal (L−R) in relative phase opposition to the adder circuits 6 and 7, respectively. In these adder circuits 6 and 7, the stereo difference signal (L−R) is added to the stereo sum signal (L+R) of the stereo multiplex signal so that the decoded stereo signals L and R become available at the outputs of the adder circuits 6 and 7, which after amplification in the audio amplifiers 8 and 9 are reproduced via loudspeakers 10 and 11.

However, in practice a phase jitter is obtained due to temperature variation and/or ageing of the components of the function generator 4 and this phase jitter disturbs the ideal form of the 38 kHz mixing signal. In FIG. 1B the phase jitter is indicated by dotted lines, within which phase interval the edges of the mixing signals can vary due to the said phase jitter. The phase jitter introduces peak-shaped interference components at or near higher harmonics of the 38 kHz fundamental wave of the mixing signal, which—due to (mostly capacitive) cross-talk—arrive in the output signal of the mixer stage 5 and may lead to an annoying disturbance therein. These peak-shaped interference components are accurately frequency-coupled via the mixing signal to the 228 kHz clock signal, that is to say that at a frequency variation of the clock signal the frequency location of the interference components also varies. Similar interference components may be obtained due to the fact that when the time-discrete mixing signal is multiplied with the stereo multiplex signal, use is made of clock-controlled switches in the mixer stage 5. The clock signals by which these switches are controlled may also disturb the output signal of the mixer stage 5 due to cross-talk. Moreover, the stereo multiplex signal supplied to the mixer stage 5 comprises a 19 kHz stereo pilot signal which itself, as any higher harmonics thereof produced in the mixer stage 5 due to non-linearities, is unwanted in the output signal of the mixer stage 5. The suppression of the interference components takes place in the filtering arrangements 12, 13 and 14, 15, which are connected between the adder circuits 6 and 7 on the one hand and the audio amplifiers 8 and 9 on the other hand, respectively.

The filtering arrangement 12, 13 comprises a subtraction device 12, of which a first input is connected to an output of the adder circuit 6 and of which an output is fed back negatively via a comb filter 13 to a second input of the subtraction device 12. The comb filter 13 is of the switched capacitor N-path filter type with narrow peak-shaped pass frequency ranges and a high signal amplification within these pass frequency ranges and is clock-controlled from the phase-locked loop 3. The pass frequency ranges are located near the frequency 0 (DC) and in the present case at the 19 kHz stereo pilot frequency and a number of harmonics thereof. A further description of the operation of this comb filter is given with reference to FIG. 2A-2D.

The interference components in the output signal of the adder circuit 6 within said pass frequency ranges are suppressed by a strong negative feedback via the comb filter 13 in the subtraction device 12. Since the clock signal of the phase-locked loop 3 determines the frequency location both of the interference components and of the pass frequency ranges of the comb filter 14 these interference components are frequency-coupled to said pass frequency ranges. A correct selection of interference components is therefore guaranteed even at a varying clock frequency.

The suppression of interference components by means of negative feedback has the advantage with respect to the suppression by means of a forward control that for an adequate suppression of interference the amplification in the negative feedback loop need not be determined accurately, but only has to be larger than the value, at which said suppression is acceptable. As a result, the use of a comb filter of the latter type becomes possible.

A similar suppression of interference takes place in the filtering arrangement 14, 15 which is realized by a negative feedback via a comb filter 15 in a subtraction device 14. The comb filter 15 is of the same type as the comb filter 13 and is also clock-controlled from the phase-locked loop 3.

Figure 1D:
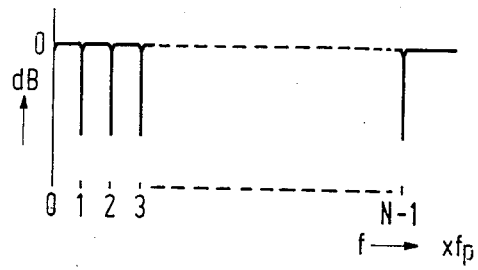
FIG. 1D shows the frequency characteristic of the filtering arrangement according to the invention.

FIG. 1D shows the frequency characteristic of the two filtering arrangements 12, 13 and 14, 15. The direct current component and the components at the higher harmonics of the 19 kHz stereo pilot frequency ($f_p$) are drastically suppressed therein.

Figure 2A:
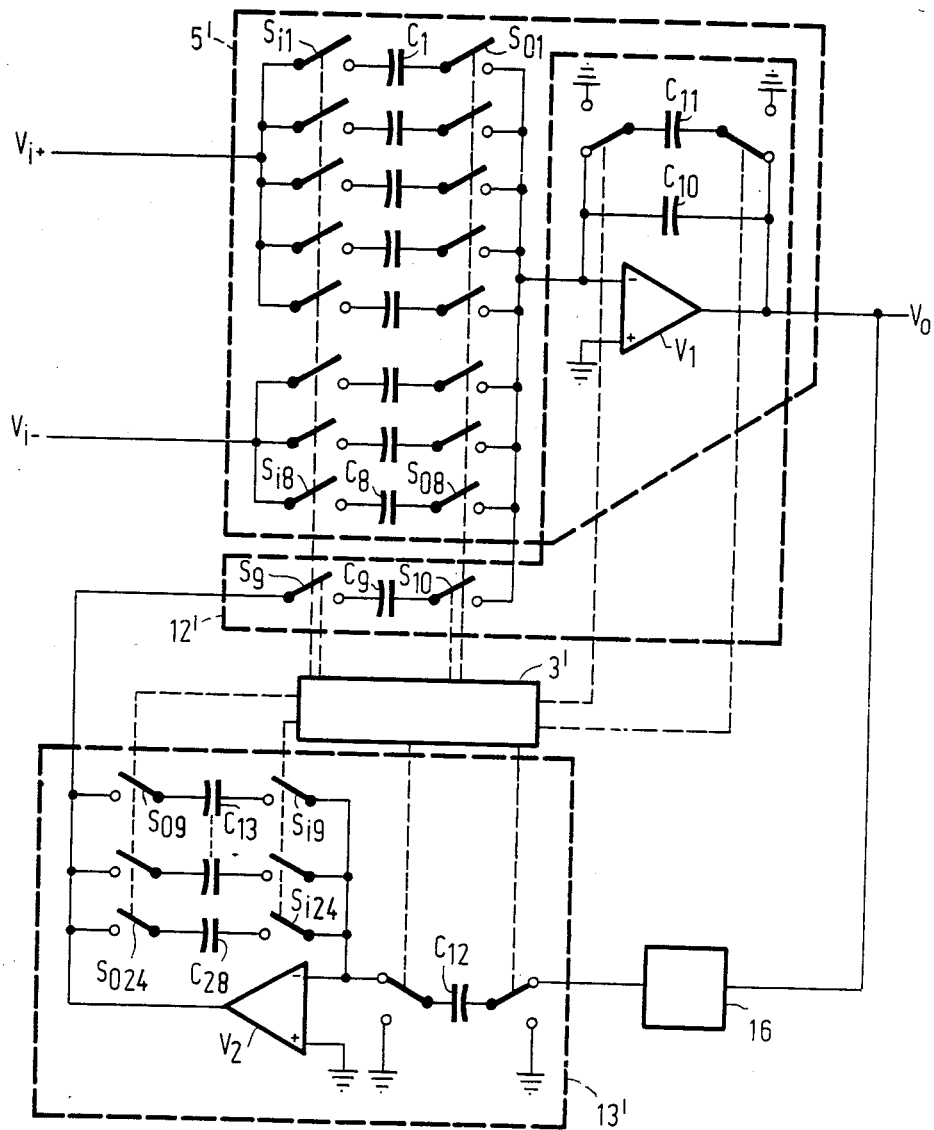
FIG. 2A shows a practical embodiment of a filtering arrangement according to the invention in combination with a clock-controlled multiplier circuit.
Figure 2B:
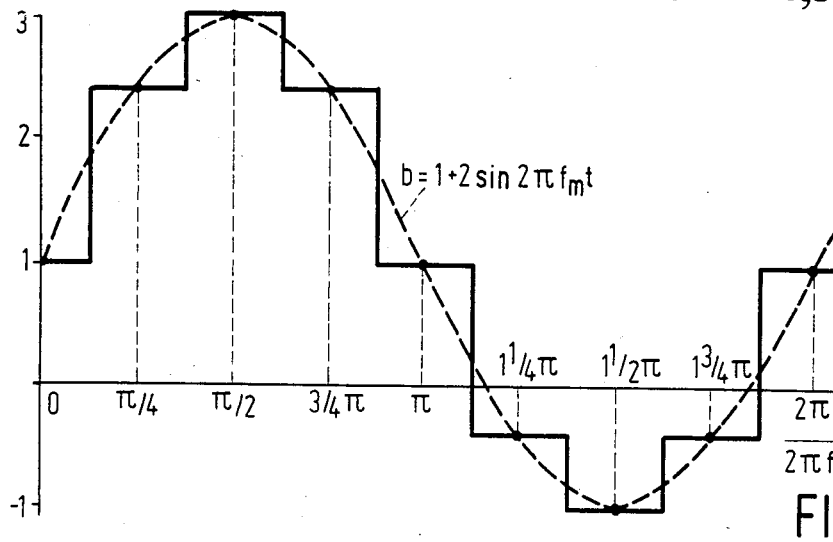
FIG. 2B shows the variation of a time-discrete 5-level mixed signal.

FIG. 2A shows an embodiment of a filtering arrangement according to the invention in combination with a clock-controlled multiplier circuit, which is particularly suitable for integration. In contrast with the embodiment shown in the preceding FIG. 1A, in this case the stereo multiplex signal to be demodulated is sampled and at a sampling frequency of 304 kHz weighted instead of being multiplied with a time-discrete mixing signal. For a further description of this signal processing, reference is invited to the Dutch Patent Application No. 8,104,668 not yet published.

As is known therefrom, the weighted sampling in the multiplier circuit 5' shown is effected by supplying the stereo multiplex signal at the sampling frequency of 304 kHz through a sequential arrangement of a number of parallel capacitors $C_1$–$C_8$ in a time-discrete manner to a negative input of an operational amplifier $V_1$. For this purpose, pairs of switches $S_{i1}$, $S_{o1}$–$S_{i8}$, $S_{o8}$ are closed sequentially each at a 38 kHz switching frequency for a short time (preferably < 1/304 msec). The operational amplifier $V_1$ is shunted from an output to the negative input via a parallel arrangement of a fixed capacitor $C_{10}$ and a switchable capacitor $C_{11}$. The switchable capacitor $C_{11}$ is switched with a 304 kHz switching signal and only serves for the DC voltage adjustment at the negative input of the operational amplifier $V_1$. The capacitance value of $C_{11}$ is therefore very small ($\approx 0.04$ pF).

The weighting factors during the sequential signal samplings are mainly determined by the ratio of the capacitance values of each of the capacitors $C_1$–$C_8$ on the one hand and that of the capacitor $C_{10}$ on the other hand. These weighting factors are chosen so that the result of said sampling corresponds to that of a multiplication of the stereo multiplex input signal with a time-discrete 5-level 38 kHz mixing signal, as indicated by full lines in FIG. 2B. The functions of the mixer stage 5 and one of the adder circuits 6 or 7 of the preceding FIG. 1A are carried out simultaneously with such a multiplication. The dotted line b in FIG. 2B indicates the form of the function $1+2 \sin 2\pi f_m t$ with $f_m = 38$ kHz. The levels of the time-discrete 5-level mixing signal are determined by the value of the last-mentioned function, at $2\pi f_m t = K.\pi/4$ with $K = 0, 1, 2, 3, \ldots$ These values are 1, $1+\sqrt{2}$, 3, $1+\sqrt{2}$, $1-\sqrt{2}$, $-1$, $1-\sqrt{2}$, 1 . . . etc. The aforementioned weighting factors are caused to correspond therewith by a suitable choice of the capacitance values of $C_1$–$C_8$ and $C_{10}$. In order to realize negative weighting factors by means of capacitors $C_6$–$C_8$, these capacitors $C_6$–$C_8$ have supplied to them via the switches $S_{i6}$–$S_{i8}$ in a time-discrete manner the oppositely polarized stereo multiplex signal $V_i-$. For this purpose, the stereo multiplex input signal must be available in balanced state.

Figure 2C:
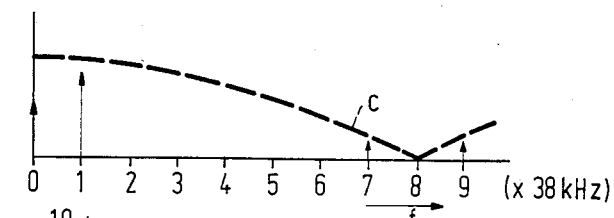
FIG. 2C shows the frequency spectrum of this time-discrete 5-level mixed signal.

The frequency spectrum of said time-discrete 5-level mixing signal is indicated by full lines in FIG. 2C. This signal comprises beside a DC component and the 38 kHz fundamental wave (fm) only components of higher order at $(8K \pm 1).f_m$ with $K = 1, 2, 3 \ldots$ In FIG. 2C, the form of the function $\sin 2\pi f_m t / 2\pi f_m t$ is indicated by a dotted curve c, of which the zero points are located at $8K.f_m$ with $K = 1, 2, 3, \ldots$ due to the chosen pulse width ($2\pi f_m t = \pi/4$). No interference components of higher order can occur at these zero points so that in the ideal case interference components can occur only at the frequencies $f_m$ and $(8K \pm 1)f_m$ with $K = 1, 2, 3, \ldots$, which are inherent to the chosen discrete 5-level mixing signal or to the chosen manner of sampling.

In practice, interference components are formed at the remaining harmonics of $f_m$ and at $f_p = \frac{1}{2} f_m$ (19 kHz) due to, for example, phase jitter in the switching control signals originating from a pilot-controlled clock generator 3' and capacitive cross-talk of these switching control signals or of the 19 kHz stereo pilot signal in the stereo multiplex input signal via the relevant switches. Both the latter interference components and the former interference components which are inherent to the chosen manner of sampling are frequency-coupled to the clock frequency at which the switching process is controlled and hence to the stereo pilot signal which controls the clock generator 3'.

In order to obtain an effective interference suppression in this practical situation, the interference components in the output signal $V_0$ are strongly fed back negatively via a negative feedback loop comprising an inversion circuit 16, a comb filter 13' and an adder circuit 12'. The inversion circuit 16 and the adder circuit 12' then replace the subtraction device 12 and 14, respectively, of the preceding FIG. 1A. However, it is quite possible to realize a signal inversion by a modification in the comb filter 13' or the adder circuit 12' that can be provided in a very simple manner by those skilled in the art, as a result of which the inversion circuit 16 can be avoided.

In the given embodiment, the inversion circuit 16 supplies the output signal $V_0$ after a signal inversion to the comb filter 13'. This comb filter 13' is known per se from the aforementioned article by Allstot and Tan and comprises a switched capacitor $C_{12}$ which connects time-discretely at a switching frequency of 304 kHz supplied by the clock generator 3' the inversion circuit 16 to a negative input of an operational amplifier $V_2$.

The operational amplifier $V_2$ is shunted by 16 equal parallel switchable capacitors $C_{13}$–$C_{28}$ from an output to said negative input. The capacitors $C_{13}$–$C_{28}$ are each sequentially switched through via pairs of switches $S_{i9}$, $S_{o9}$–$S_{i24}$, $S_{o24}$ for a short time (preferably < 1/304 msec) at a 19 kHz switching frequency, which is supplied by the clock generator 3'. As is known, such a signal processing results in significant signal increases to frequencies $K.f_p$ with K=0, 1, 2 ... 15 and with $f_p$=19 kHz. The bandwidth of the pass ranges is then mainly determined by the capacitance ratio between each of the capacitors $C_{13}$-$C_{28}$ on the one hand and the capacitor $C_{12}$ on the other hand, whilst the amplification in these ranges is mainly determined by the open loop amplification of the operational amplifier $V_2$. The frequency location of these ranges is determined by the clock frequency and is coupled via this frequency to the frequency locations of the interference components to be suppressed. Consequently, a stable selection of interference components is guaranteed.

These selected interference components, which, due to the signal inversion in the inversion circuit 16, have a polarity opposite to that of the interference components in the output signal $V_o$, compensate for the latter interference components in the adder stage 12'. The adder stage 12' for this purpose comprises a capacitor $C_9$ which connects via a pair of switches $S_9$, $S_{10}$ at a switching frequency of 304 kHz the output of the comb filter 13' to the negative input of the operational amplifier $V_1$, in which said compensation of interference components takes place. This operational amplifier $V_1$ also forms part of the adder stage 12'.

In a practical embodiment, the values of the capacitors $C_9$ and $C_{13}$-$C_{28}$ were 1 pF and the values of the capacitors $C_{11}$ and $C_{12}$ were 0.04 pF and 14.4 pF, respectively, while the values of the capacitors $C_1$-$C_8$ were chosen in correspondence with the aforementioned wanted weighting factors.

Figure 2D:
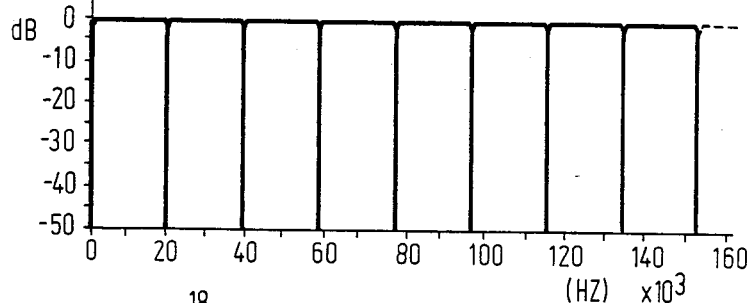
FIG. 2D shows the frequency spectrum of the filtering arrangement shown in the preceding FIG. 2A.

FIG. 2D shows in part the frequency characteristic of the whole filtering arrangement. The latter has sharp suppression peaks at 0 Hz (DC), at the 19 kHz stereo pilot frequency and at a number of harmonics thereof.

Figure 3:
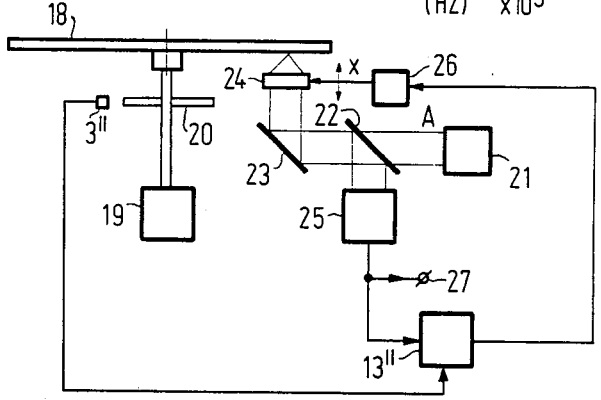
FIG. 3 shows an application of a filtering arrangement according to the invention in a servo control loop of a reading device for disk-shaped record carriers.

FIG. 3 shows a servo control loop in a reading device for disk-shaped record carriers comprising a record carrier 18 and a driving motor 19 provided with a tachometer disk 20 co-operating with a pick-up element 3". The pick-up element 3" supplies as clock signal a pulse sequence which is in relation to the rotation speed of the record carrier 18 and may be, for example, a multiple thereof. The record carrier 18 is read out by means of a radiation beam A which is emitted by a radiation source 21 and is directed via a semi-transparent mirror 22, a mirror 23 and a lens system 24 to the information surface of the record carrier 18. This information surface has the form of a reflective surface so that the radiation beam A is reflected and arrives via the lens system 24, the mirror 23 and the semi-transparent mirror 22 at a detection device 25. This detection device 25 converts the information present in the radiation beam A, for example video information, into an electrical signal, which becomes available at an output 27 for a further signal processing not shown.

In order to keep the scanning spot produced by the radiation beam A accurately focussed on the information surface, irrespective of vertical movements of this information surface, a focussing servo control loop is provided. This focussing servo control loop comprises an adjusting member 26, by which the lens system 24 can be displaced in the direction x for controlling the focussing and an error detection system for supplying an error signal which is a measure for the deviation in the focussing. This reading device described thus far is known per se from the Dutch Patent Application No. 7901721 laid open for public inspection.

In the given embodiment, the error detection system is constituted by a comb filter 13", which is of the switched capacitor N-path filter type. This comb filter 13" selects interference components in the output signal of the detection device 25 and supplies them in such a phase to the adjusting member 26 that the deviation in the focussing is corrected by an adequate displacement of the lens system 24. The interference negative feedback in the servo control loop thus obtained results in a suppression of the interference components in the signal at the output 27.

In order to maintain a correct selection of interference components even with a varying speed of rotation, the comb filter 13" is clock-controlled from the pick-up element 3". In contrast with the reading device of the aforementioned Dutch Patent Application No. 7901721 laid open for public inspection, in which use is made of a digital comb filter, in this case no expensive A/D and D/A converters are required on the one hand, while on the other hand, as in the known reading device, a cumulation of errors cannot occur.

What is claimed is:

1. In a system having first means for furnishing system input signals comprising a desired signal and interference signals including a base frequency signal and additional signals having related frequencies varying in accordance with variations in said base frequency, said system further having clock signal generator means coupled to said first means so that the frequency of said clock signal generator means varies in accordance with variations of said base frequency, and output means for furnishing system output signals, the improvement comprising:
   a switched capacitor N-path filter connected to said clock signal furnishing means so that said filter is switched in accordance with said clock frequency, said switched capacitor N-path filter having a filter input connected to said system output, and a filter output for furnishing filter output signals, said filter having narrow pass bands at said base frequency and said related frequencies thereof; and
   means connected to said system input signal furnishing means, said filter output and said output means, for subtracting said filter output signals from said system input signals thereby creating difference signals and applying said difference signals to said output means, whereby said system output signals comprise said desired signals and substantially decreased or eliminated interference signals.

2. A system as set forth in claim 1, wherein said first means comprises receiving means for receiving FM stereo multiplex signals, FM detector means connected to said receiving means for generating base band stereo multiplex signals in response to said FM stereo multiplex signals, and clock-controlled means connected to said clock signal generating means and said FM detector means for generating said system input signals in response to said base band stereo multiplex signals and under the control of said clock signals.

3. A system as set forth in claim 1, wherein said first means comprises information carrier means rotating at said base frequency, means for applying an incident beam to said information carrier means, whereby said information carrier means generates a read-out beam having said desired signals and said interference signals;
   wherein said output means comprises detector means receiving said read-out beam and connected to said system output for generating said system output signals corresponding to information in said read-out beam;

wherein said clock signal generating means comprises pick-up means positioned relative to said information carrier means for generating said clock signals at a frequency varying in accordance with said rotation of said information carrier means; and wherein said switched capacitor N-path filter means has said filter input connected to said detector output, said filter output connected to said beam applying means and a switching input connected to said pick-up means.

4. A system as set forth in claim 1, wherein said clock signal generating means comprises a phase-locked loop.

* * * * *